(12) United States Patent
Wang

(10) Patent No.: US 12,080,719 B2
(45) Date of Patent: Sep. 3, 2024

(54) DISPLAY PANEL AND DISPLAY DEVICE

(71) Applicant: GUANGZHOU CHINA STAR OPTOELECTRONICS SEMICONDUCTOR DISPLAY TECHNOLOGY CO., LTD., Guangdong (CN)

(72) Inventor: Hang Wang, Guangdong (CN)

(73) Assignee: GUANGZHOU CHINA STAR OPTOELECTRONICS SEMICONDUCTOR DISPLAY TECHNOLOGY CO., LTD., Guangzhou (CN)

(*) Notice: Subject to any disclaimer, the term of this patent is extended or adjusted under 35 U.S.C. 154(b) by 0 days.

(21) Appl. No.: 18/156,790

(22) Filed: Jan. 19, 2023

(65) Prior Publication Data
US 2024/0204003 A1 Jun. 20, 2024

(30) Foreign Application Priority Data
Dec. 15, 2022 (CN) .......................... 202211626062.4

(51) Int. Cl.
*G02F 1/1333* (2006.01)
*G02F 1/1335* (2006.01)
(Continued)

(52) U.S. Cl.
CPC ........ *H01L 27/1225* (2013.01); *G02F 1/1368* (2013.01); *H01L 27/1218* (2013.01); *G02F 1/133345* (2013.01); *G02F 1/133514* (2013.01); *G02F 1/134372* (2021.01); *G02F 1/136222* (2021.01)

(58) Field of Classification Search
CPC ............. G02F 1/1333; G02F 1/133345; G02F 1/133357; G02F 1/1335; G02F 1/133514; G02F 1/134372; G02F 1/1362; G02F 1/136222; G02F 1/1368; H01L 27/1218; H01L 27/1225
See application file for complete search history.

(56) References Cited

U.S. PATENT DOCUMENTS

| 2008/0024402 A1* | 1/2008 | Nishikawa | H05B 33/22 345/82 |
| 2018/0196314 A1* | 7/2018 | Tago | G02F 1/133345 |

(Continued)

*Primary Examiner* — Thoi V Duong
(74) *Attorney, Agent, or Firm* — PV IP PC; Wei Te Chung; Zhigang Ma

(57) ABSTRACT

A display panel and a display device are provided. An array substrate of the display panel includes a first substrate, a first insulating layer, a second insulating layer, and a first transparent insulating layer. An absolute value of a difference between a refractive index of the first transparent insulating layer and a refractive index of the first insulating layer is greater than 0.1. An absolute value of a difference between the refractive index of the first transparent insulating layer and a refractive index of the second insulating layer is greater than 0.1. The first transparent insulating layer is added between the first insulating layer and the second insulating layer to cause a large refractive index difference, so color points of the display panel can be adjusted to meet requirements for different color point specifications without reducing gray scales of the display panel.

18 Claims, 5 Drawing Sheets

(51) Int. Cl.
*G02F 1/1343* (2006.01)
*G02F 1/1362* (2006.01)
*G02F 1/1368* (2006.01)
*H01L 27/12* (2006.01)

(56) References Cited

U.S. PATENT DOCUMENTS

2020/0027958 A1* 1/2020 Suzuki .............. H01L 29/66969
2020/0285124 A1* 9/2020 Duan ................. H01L 27/1262

* cited by examiner

DISPLAY PANEL AND DISPLAY DEVICE

FIELD OF DISCLOSURE

The present application relates to a field of display techniques and in particular, to a display panel and a display device.

DESCRIPTION OF RELATED ART

Liquid crystal display panels (LCD) are currently the most widely used displays. Compared with conventional cathode ray tube (CRT) displays, LCD has the advantages such as thinness, low power consumption, low driving voltages.

Because customers have different requirements for backlight spectrum and product specifications, LCD panels manufactured by a same manufacturing method cannot meet individual requirements for different color point or color dot specifications at the same time. The color dots or color points can be determined by a CIE color coordinates chart. Industries usually reduce gray scales to satisfy individual requirements for different color point specifications. However, this results in lower energy efficiency of the LCD panel.

In summary, the conventional LCD panels have problems of lower energy efficiency due to a gray-scale reduction. Therefore, it is necessary to provide a display panel to solve the problems.

SUMMARY

The present application provides a display panel and a display device, which can meet requirements for different color point specifications without reducing gray scales, and improve energy efficiency of the display panel.

The present application provides a display panel, comprising an array substrate, wherein the array substrate comprises:
  a first substrate;
  a first insulating layer disposed on the first substrate;
  a second insulating layer disposed on one side of the first insulating layer away from the first substrate; and
  a first transparent insulating layer disposed between the first insulating layer and the second insulating layer, and in direct contact with at least a portion of the first insulating layer and at least portion of the second insulating layer;
  wherein an absolute value of a difference between a refractive index of the first transparent insulating layer and a refractive index of the first insulating layer is greater than 0.1, and an absolute value of a difference between the refractive index of the first transparent insulating layer and a refractive index of the second insulating layer is greater than 0.1.

According to one embodiment of the present application, a material of the first insulating layer is same as a material of the second insulating layer, and the refractive index of the first insulating layer and the refractive index of the second insulating layer are both greater than the refractive index of the first transparent insulating layer.

According to one embodiment of the present application, the difference between the refractive index of the first insulating layer and the refractive index of the first transparent insulating layer ranges from 0.2 to 0.5, and the difference between the refractive index of the second insulating layer and the refractive index of the first transparent insulating layer ranges from 0.2 to 0.5.

According to one embodiment of the present application, the array substrate comprises:
  a first metal layer comprising a gate and a gate line, wherein the first metal layer is disposed between the first insulating layer and the first substrate; and
  a second metal layer comprising a source and a drain, wherein the second metal layer is disposed between the first insulating layer and the second insulating layer;
  wherein the first transparent insulating layer is disposed between the second metal layer and the first insulating layer, or the first transparent insulating layer is disposed between the second metal layer and the second insulating layer.

According to one embodiment of the present application, the array substrate comprises an active layer, a material of the active layer comprises an oxide semiconductor, a material of the first insulating layer is different from a material of the second insulating layer, and the refractive index of the first transparent insulating layer is between the refractive index of the first insulating layer and the refractive index of the second insulating layer.

According to one embodiment of the present application, the absolute value of the difference between the refractive index of the first insulating layer and the refractive index of the first transparent insulating layer ranges from 0.1 to 0.5, and the absolute value of the difference between the refractive index of the second insulating layer and the refractive index of the first transparent insulating layer ranges from 0.1 to 0.5.

According to one embodiment of the present application, a material of the first insulating layer is silicon nitride, a material of the second insulating layer is silicon oxide, and a material of the first transparent insulating layer is different from the material of the first insulating layer and the material of the second insulating layer, and the second insulating layer is disposed between the first insulating layer and the active layer.

According to one embodiment of the present application, the material of the first transparent insulating layer is any one of silicon oxide, silicon oxynitride, indium tin oxide, aluminum oxide, conductorized indium gallium zinc oxide, conductorized indium zinc oxide, or conductorized indium gallium zinc tin oxide.

According to one embodiment of the present application, the display panel comprises an opposite substrate, the opposite substrate is disposed corresponding to the array substrate, the opposite substrate comprises a second substrate, a transparent conductive layer, and a second transparent insulating layer, the transparent conductive layer is disposed on one side of the second substrate away from the array substrate, and the second transparent insulating layer is disposed between the second substrate and the transparent conductive layer;
  wherein an absolute value of a difference between a refractive index of the second transparent insulating layer and a refractive index of the second substrate is greater than 0.2, and an absolute value of a difference between the refractive index of the second transparent insulating layer and a refractive index of the transparent conductive layer is greater than 0.2.

According to one embodiment of the present application, the refractive index of the transparent conductive layer is greater than the refractive index of the second substrate, and the refractive index of the second transparent insulating layer is between the refractive index of the transparent conductive layer and the refractive index of the second substrate.

Advantages of the present application: The present application provides a display panel and a display device. The display panel includes an array substrate. The array substrate includes a first substrate, a first insulating layer, a second insulating layer, and a first transparent insulating layer. The first insulating layer is disposed on the first substrate. The second insulating layer is disposed on one side of the first insulating layer away from or close to the first substrate. The first transparent insulating layer is disposed between the first insulating layer and the second insulating layer. An absolute value of a difference between a refractive index of the first transparent insulating layer and a refractive index of the first insulating layer is greater than 0.1. An absolute value of a difference between the refractive index of the first transparent insulating layer and a refractive index of the second insulating layer is greater than 0.1. The first transparent insulating layer is added between the first insulating layer and the second insulating layer to cause a large difference in refractive index, so color points of the display panel can be adjusted to meet requirements for different color point specifications without reducing gray scales of the display panel. As a result, the energy efficiency of the display panel is improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
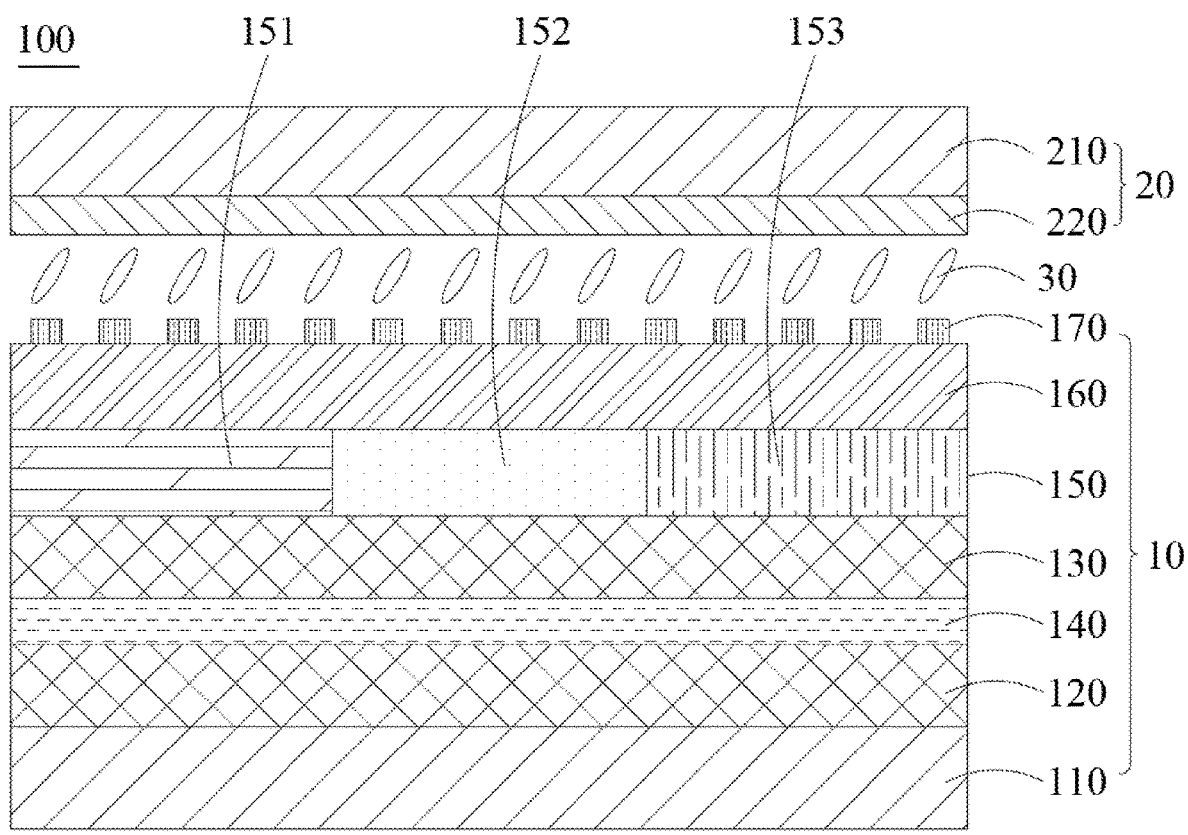
FIG. 1 is a schematic view illustrating a film layer structure of a display panel according to a first embodiment of the present application.

The present application is described with reference to accompanying drawings to illustrate specific embodiments. Directional terms mentioned in the present application, such as "top", "bottom", "front", "rear", "left", "right", "inside", "outside", and "side", are for illustrative purposes based on the directions shown in the accompanying drawings. Therefore, the directional terms are used to illustrate and understand the application, but are not intended to limit the present application. In the drawings, structurally similar elements are denoted by the same reference numerals.

The present application is described below in conjunction with the accompanying drawings and specific embodiments.

The present application provides a display panel, which can meet the requirements for different color point specifications without reducing gray scales, and improve energy efficiency of the display panel.

Please refer to FIG. 1, which is a schematic view illustrating a film layer structure of a display panel 100 according to a first embodiment of the present application. The display panel 100 is a liquid crystal display panel. The display panel 100 includes an array substrate 10. The array substrate 10 can include a first insulating layer 120, a first transparent insulating layer 140, a second insulating layer 130 sequentially stacked on the first substrate 110. The first transparent insulating layer 140 is in direct contact with at least a portion of the first insulating layer 120 and at least a portion of the second insulating layer 130.

An absolute value of a difference between a refractive index of the first transparent insulating layer 140 and a refractive index of the first insulating layer 120 is greater than 0.1, and an absolute value of a difference between the refractive index of the first transparent insulating layer 140 and a refractive index of the second insulating layer 130 is greater than 0.1.

In one embodiment, the first insulating layer 120 can also be called a gate insulating layer, and the second insulating layer 130 can also be called a passivation protection layer.

It should be noted that film layers with different refractive indices absorb and reflect light of a same wavelength differently, and the absorption and reflection of light with different wavelengths are also different. When light reflects and refracts between film layers with a large difference in refractive index therebetween, different wavelengths of the light also reflect and refract differently, causing light finally emitted from the display panel 100 to have color points with relatively large differences. Because the first transparent insulating layer 140 added between the first insulating layer 120 and the second insulating layer 130 has a large refractive index difference from the first insulating layer 120 and the second insulating layer 130, the color points of the display panel can be adjusted to satisfy the requirements for different color point specifications without reducing gray scales of the display panel, so that the energy efficiency of the display panel can be improved.

Regarding the first insulating layer 120 disposed on the first substrate 110, the first insulating layer 120 can be located above the first substrate 110 and in direct contact with the first substrate 110; or alternatively, the first insulating layer 120 can be located above the first substrate 110, but separated from the first substrate 110 by other film layers (e.g., a metal layer and a gate insulating layer).

As shown in FIG. 1, the first insulating layer 120 is located above the first substrate 110 and is in direct contact with the first substrate 110. The first insulating layer 120 can also be called a gate insulating layer. The second insulating layer 130 is located above the first insulating layer 120. The second insulating layer 130 is separated from the first substrate 110 by the first insulating layer 120 and the first transparent insulating layer 140. The second insulating layer 130 can also be called a passivation protection layer.

Furthermore, as shown in FIG. 1, the array substrate further includes a color filter layer 150, a planarization layer 160, and a pixel electrode layer 170.

The color filter layer 150 can include, but is not limited to, a plurality of first filter units 151, a plurality of second filter units 152, and a plurality of third filter units 153. The first filter unit 151, the second filter unit 152, and the third filter unit 153 are of different colors, and the colors can be selected from red, green, or blue respectively. The color filter layer 150 can also include a light-shielding pattern disposed between the filter units.

In one embodiment, a material of the first insulating layer 120 is the same as a material of the second insulating layer 130, and the refractive indices of the first insulating layer 120 and the second insulating layer 130 are both greater than the refractive index of the first transparent insulating layer 140.

Specifically, the material of the first insulating layer 120 and the material of the second insulating layer 130 are both silicon nitride. A material of the first transparent insulating layer 140 is different from the material of the first insulating layer 120 and the material of the second insulating layer 130.

Furthermore, the difference between the refractive index of the first insulating layer 120 and the refractive index of the first transparent insulating layer 140 ranges from 0.2 to 0.5. The difference between the refractive index of the second insulating layer 130 and the first transparent insulating layer 140 ranges from 0.2 to 0.5. For example, the difference between the refractive index of the first insulating layer 120 and the refractive index of the first transparent insulating layer 140 can be, but not limited to, 0.2, 0.21, 0.25, 0.3, 0.4, or 0.5, and the difference between the refractive index of the second insulating layer 130 and the refractive index of the first transparent insulating layer 140 can be, but not limited to, 0.2, 0.21, 0.25, 0.3, 0.4, or 0.5.

It should be noted that within the above-mentioned range of the difference in refractive index, it can be ensured that the difference in refractive index between the first transparent insulating layer 140 and the first insulating layer 120 and between the first transparent insulting layer 140 and the second insulating layer 130 is great enough. As a result, by adjusting the refractive index of the first transparent insulating layer 140, color points of the display panel can be adjusted, thus preventing the energy efficiency from being lowered by a reduction of gray scales. Furthermore, the refractive index of the first insulating layer 120 is in a range from 1.8 to 2.0, the refractive index of the second insulating layer 130 is in a range from 1.8 to 2.0, and the refractive index of the first transparent insulating layer 140 is in a range from 1.2 to 1.7. It can be understood that each of the above refractive index ranges includes the values at two ends of the range.

In one embodiment, the refractive index of the first insulating layer 120 is 1.8, the refractive index of the second insulating layer 130 is 1.8, and the refractive index of the first transparent insulating layer 140 is 1.6. In one embodiment, the refractive index of the first insulating layer 120 is 2.0, the refractive index of the second insulating layer 130 is 2.0, and the refractive index of the first transparent insulating layer 140 is 1.5.

In other embodiments, the refractive index of the first insulating layer 120 can also be, but not limited to, 1.81, 1.85, 1.90, 1.90, etc., as long as the refractive index is between 1.8 and 2.0. The refractive index of the second insulating layer 130 can also be, but not limited to, 1.81, 1.85, 1.90, 1.90, etc., as long as the refractive index is between 1.8 and 2.0. In practice, the refractive index of the first insulating layer 120 and the refractive index of the second insulating layer 130 can be equal or not equal. The refractive indices of the first insulating layer 120, the second insulating layer 130, and the first transparent insulating layer 140 can be selected according to the color point specifications, and the present application is not limited in this regard.

Further, a thickness of the first transparent insulating layer 140 is less than a thickness of the first insulating layer 120, and the thickness of the first transparent insulating layer 140 is less than a thickness of the second insulating layer 130. In the embodiment shown in FIG. 1, the thickness of the first insulating layer 120 is in a range from 3000 angstroms to 5000 angstroms, and the thickness of the second insulating layer 130 is in a range from 500 angstroms to 2000 angstroms. The thickness of the first transparent insulating layer 140 is in a range from 0 to 2000 angstroms. It can be understood that each of the ranges of the thicknesses of the above film layers includes the values at two ends of the range.

It should be noted that the thickness of the newly added first transparent insulating layer 140 has a great influence on the color points of the display panel. Under the circumstance that the original thicknesses of the first insulating layer 120 and the second insulating layer 130 in the display panel are not changed, it is only necessary to limit the thickness of the first transparent insulating layer 140 to be less than the thickness of the first insulating layer 120 and the thickness of the second insulating layer 130, and limit the thickness of the first transparent insulating layer 140 to be between 0 and 2000 angstroms. By adjusting the thickness and the refractive index of the first transparent insulating layer 140, the color points of the display panel can be changed, so that the display panel manufactured by the same manufacturing process can meet the requirements for different color point specifications.

The material of the first transparent insulating layer 140 can be any one of silicon oxide, silicon oxynitride, indium tin oxide, aluminum oxide, conductorized indium gallium zinc oxide, conductorized indium zinc oxide, or conductorized indium gallium zinc tin oxide.

It should be noted that, metal oxides have relatively high absorption of light. Therefore, in order to prevent excessive reduction in a light transmittance of the display panel due to the addition of the first transparent insulating layer 140, the thickness of the first transparent insulating layer 140 can be between 0 and 2000 angstroms when the material of the first transparent insulating layer 140 is silicon oxide or silicon oxynitride. In addition to that, the thickness of the first transparent insulating layer 140 can be between 0 and 500 angstroms when the material of the first transparent insulating layer 140 is indium tin oxide, aluminum oxide, conductorized indium gallium zinc oxide, conductorized indium zinc oxide, or conductorized indium gallium zinc tin oxide. It can be understood that each of the ranges of the thicknesses of the above film layers includes the values at both ends of the range.

In one embodiment, the thickness of the first insulating layer 120 is 4000 angstroms, the thickness of the second insulating layer 130 is 1500 angstroms, and the thickness of the first transparent insulating layer 140 is 1000 angstroms.

In one embodiment, the thickness of the first insulating layer 120 is 3500 angstroms, the thickness of the second insulating layer 130 is 1000 angstroms, and the thickness of the first transparent insulating layer 140 is 500 angstroms.

In some other embodiments, the thickness of the first insulating layer 120 can also be, but not limited to, 3000 angstroms, 3300 angstroms, 4200 angstroms, 4500 angstroms, or 5000 angstroms. The thickness of the second insulating layer 130 can also be, but not limited to, 500 angstroms, 800 angstroms, 1300 angstroms, 1800 angstroms, or 2000 angstroms. The thickness of the first transparent insulating layer 140 can also be, but not limited to, 10 angstroms, 100 angstroms, 300 angstroms, 600 angstroms, 900 angstroms, 1500 angstroms, or 2000 angstroms. In practice, the thicknesses of the first insulating layer 120, the second insulating layer 130, and the first transparent insulating layer 140 can be selected according to the color point specifications, and the present application is not limited in this regard.

Furthermore, the array substrate 10 includes a first metal layer 111 and a second metal layer 112.

Figure 2:
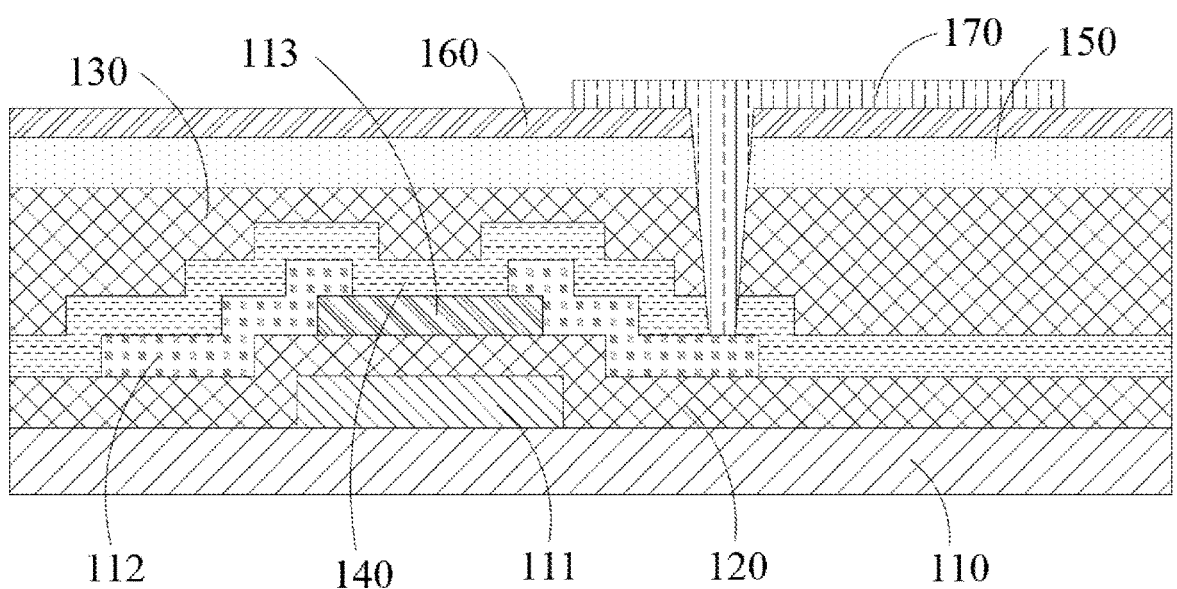
FIG. 2 is a schematic view illustrating a film layer structure of an array substrate according to the first embodiment of the present application.

Please refer to FIG. 2, which is a schematic view illustrating the film layer structure of the array substrate according to the first embodiment of the present application. The first metal layer 111 is disposed between the first insulating layer 120 and the first substrate 110, the second metal layer 112 is disposed between the first insulating layer 120 and the second insulating layer 130, and the first transparent insulating layer 140 is disposed between the second metal layer 112 and the second insulating layer 130.

In the present application, the first metal layer 111 can also be called a gate metal layer, and the first metal layer 111 can include gates and gate lines. The second metal layer 112 can also be called a source-drain metal layer, and the second metal layer 112 can include sources, drains, and data lines. The first insulating layer 120 is a gate insulating layer, and the second insulating layer is a passivation protection layer.

The array substrate 10 can further include an active layer 113. The active layer 113 is disposed between the second metal layer 112 and the first insulating layer 120. A material of the active layer 113 is amorphous silicon.

Each of the first insulating layer 120, the second insulating layer 130, and the first transparent insulating layer 140 is a transparent inorganic film layers covering an entire surface. The first transparent insulating layer 140 can be in contact with a surface of the first insulating layer 120 not covered by the second metal layer 112 and the active layer 113. The first transparent insulating layer 140 can be in direct contact with an entire surface of the second insulating layer 130 on one side close to the first substrate 110. By providing the first transparent insulating layer on the entire surface, it is not necessary to add a photomask, so a processing flow can be simplified without increasing additional costs.

Alternatively, the first transparent insulating layer may not be arranged covering the entire surface, but may be arranged at positions corresponding to opening areas of pixels, so that the absorption of light by the insulating layer can be reduced.

In one embodiment, the array substrate has a structure substantially the same as the structure of the array substrate shown in FIG. 2, except that: the first transparent insulating layer 140 is disposed between the second metal layer 112 and the first insulating layer 120.

Figure 3:
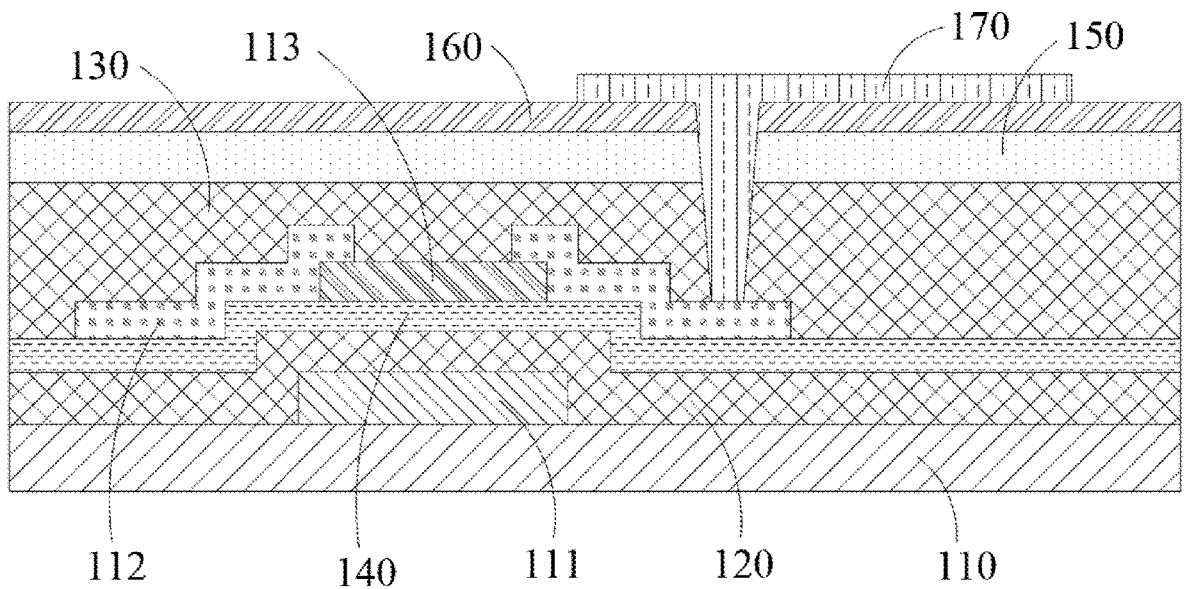
FIG. 3 is a schematic view illustrating another film layer structure of the array substrate according to the first embodiment of the present application.

Please refer to FIG. 3, which is a schematic view of another film layer structure of the array substrate according to one embodiment of the present application. The array substrate has a structure substantially the same as the array substrate shown in FIG. 2, except that: the first transparent insulating layer 140 is disposed between the second metal layer 112 and the first insulating layer 120 and between the active layer 113 and the first insulating layer 120. The first transparent insulating layer 140 is in direct contact with an entire surface of the first insulating layer 120 on one side facing away from the first substrate 110, and the second insulating layer 130 is in direct contact with a surface of the first transparent insulating layer 140 not covered by the second metal layer 112 and the active layer 113.

As shown in FIG. 1, the display panel further includes an opposite substrate 20 and a liquid crystal layer 30. The opposite substrate 20 is disposed opposite to the array substrate 10. The liquid crystal layer 30 is disposed between the array substrate 10 and the opposite substrate 20.

The opposite substrate 20 includes a second substrate 210 and a common electrode layer 220, and the common electrode layer 220 is disposed on one side of the second substrate 210 close to the array substrate 10.

Figure 4:
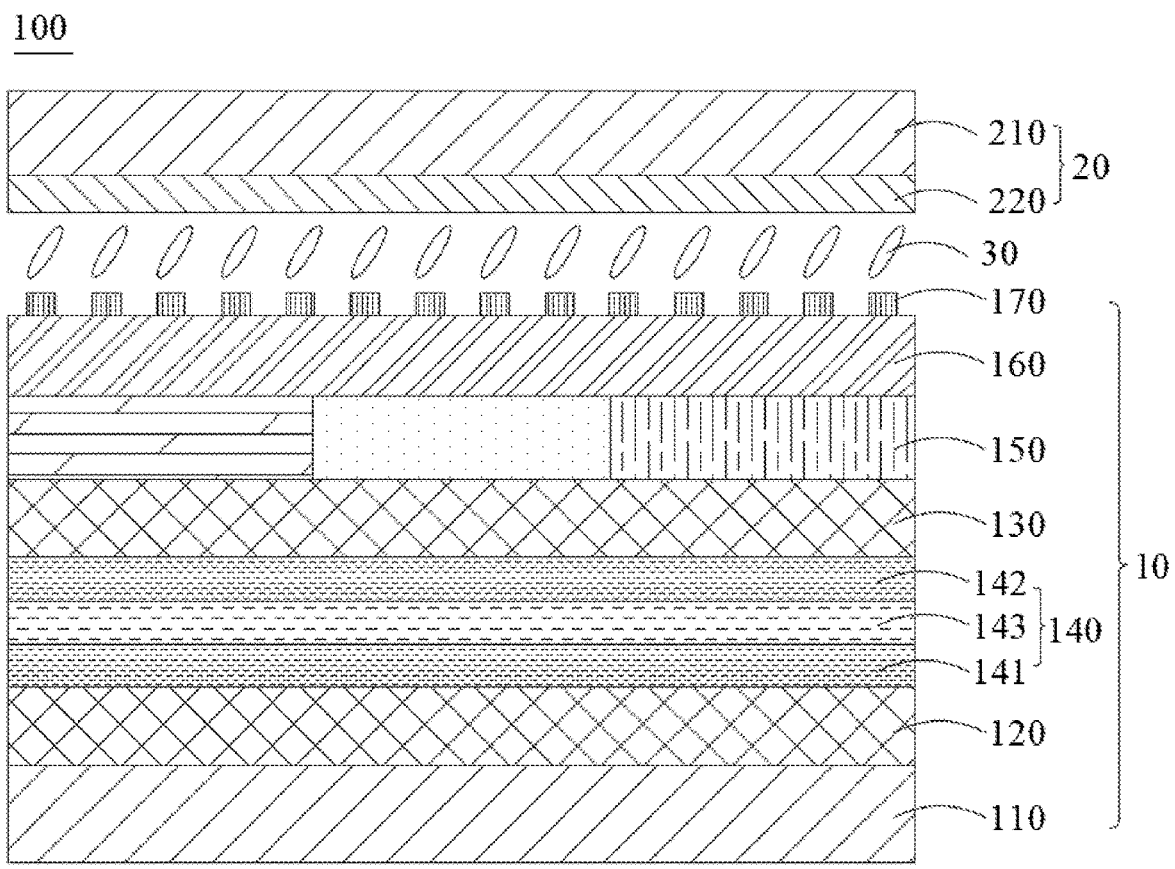
FIG. 4 is a schematic view illustrating the film layer structure of the display panel according to a second embodiment of the present application.

Please refer to FIG. 4, which is a schematic view illustrating the film layer structure of the display panel according to a second embodiment of the present application. The structure of the display panel shown in FIG. 4 is substantially the same as the structure of the display panel shown in FIG. 1, except that:

The first transparent insulating layer 140 can be a laminated structure of two or more layers. A material of each layer in the laminated structure can be the same or different, and a refractive index of each layer in the laminated structure can be the same or different. For example, when the first transparent insulating layer 140 has a laminated structure of three or more layers, the material of each layer in the laminated structure is the same, the refractive index of the middle layer of the laminated structure is the lowest, and the refractive indices of the layers on two sides of the laminated structure gradually increase to be close to and less than the refractive index of the first insulating layer 120 and the refractive index of the second insulating layer 130.

In one embodiment shown in FIG. 4, the first transparent insulating layer 140 can include a first sub-insulation layer 141, a second sub-insulation layer 142, and a third sub-insulation layer 143 which are sequentially stacked on each other. The sub-insulation layer 141, the second sub-insulation layer 142, and the third sub-insulation layer 143 are all made of silicon oxide. A refractive index of the second sub-insulation layer 142 is less than a refractive index of the first sub-insulation layer 141, and a refractive index of the second sub-insulation layer 142 is less than a refractive index of the third sub-insulation layer 143. The refractive index of the first sub-insulation layer 141 and the refractive index of the third sub-insulation layer 143 can be equal, or not equal. The refractive index of the first sub-insulation layer 141 is less than the refractive index of the first insulation layer 120, and the refractive index of the third sub-insulation layer 143 is less than the refractive index of the second insulation layer 130.

Figure 5:
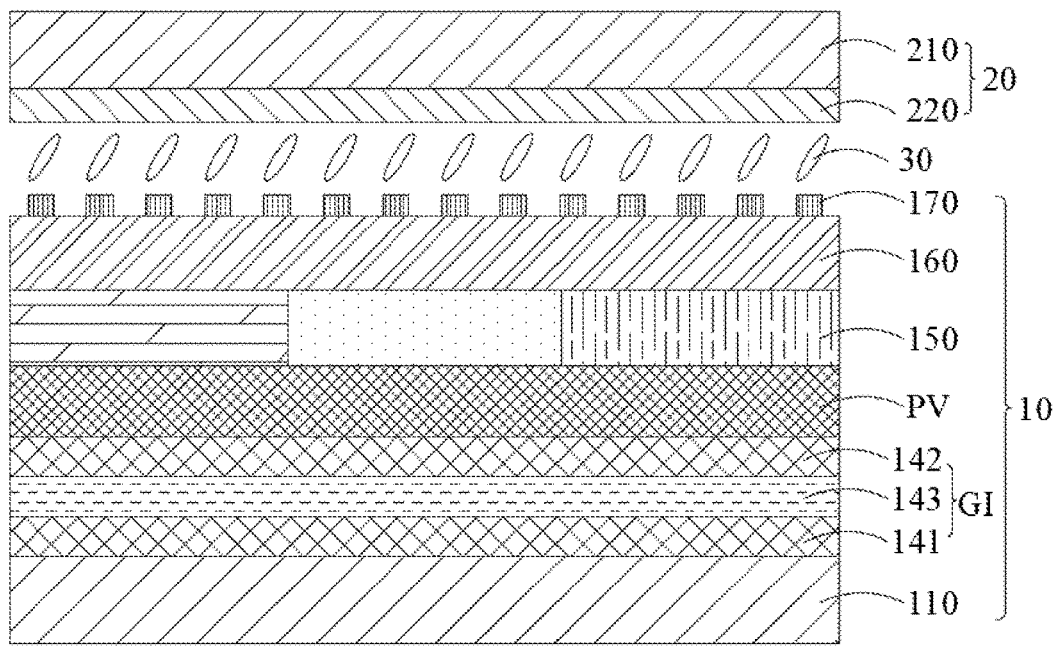
FIG. 5 is a schematic view illustrating the film layer structure of the display panel according to a third embodiment of the present application.

One embodiment is shown in FIG. 5. FIG. 5 is a schematic view illustrating the film layer structure of the display panel according to a third embodiment of the present application. The display panel is a vertical alignment liquid crystal display panel, and its structure is substantially the same as the display panels shown in FIG. 1, except that:

The array substrate can include a gate insulating layer GI and a passivation protection layer PV. At least one of the gate insulating layer GI and the passivation protection layer PV can be a laminated structure formed by stacking multiple layers of transparent inorganic materials. At least one of the gate insulating layer GI and the passivation protection layer PV can include the first insulating layer 120, the second insulating layer 130, and the first transparent insulating layer 140.

As shown in FIG. 5, the gate insulating layer GI is a laminated structure formed by stacking multiple layers of transparent inorganic materials. The passivation protection layer PV can be a single-layer structure, or can be a laminated structure formed by stacking multiple layers of a silicon nitride material.

The gate insulating layer GI is constituted by the first insulating layer 120, the second insulating layer 130, and the first transparent insulating layer 140. The first transparent insulating layer 140 is disposed between the first insulating layer 120 and the second insulating layers 130. The materials and refractive indices of the first insulating layer 120, the second insulating layer 130, and the first transparent insulating layer 140 are described in the above-mentioned embodiments, so a detailed description is not omitted here.

The first transparent insulating layer 140 is inserted in the multi-layer structure of the gate insulating layer GI. Since the first transparent insulating layer 140 has a large difference in refractive index from the first insulating layer 120 and the second insulating layer 130, the color points of the display panel can be adjusted by adjusting the refractive index and the thickness of the first transparent insulating layer 140.

In other embodiments, the passivation protection layer PV can also be a laminated structure consisting of the first insulating layer 120, the second insulating layer 130, and the first transparent insulating layer 140.

Figure 6:
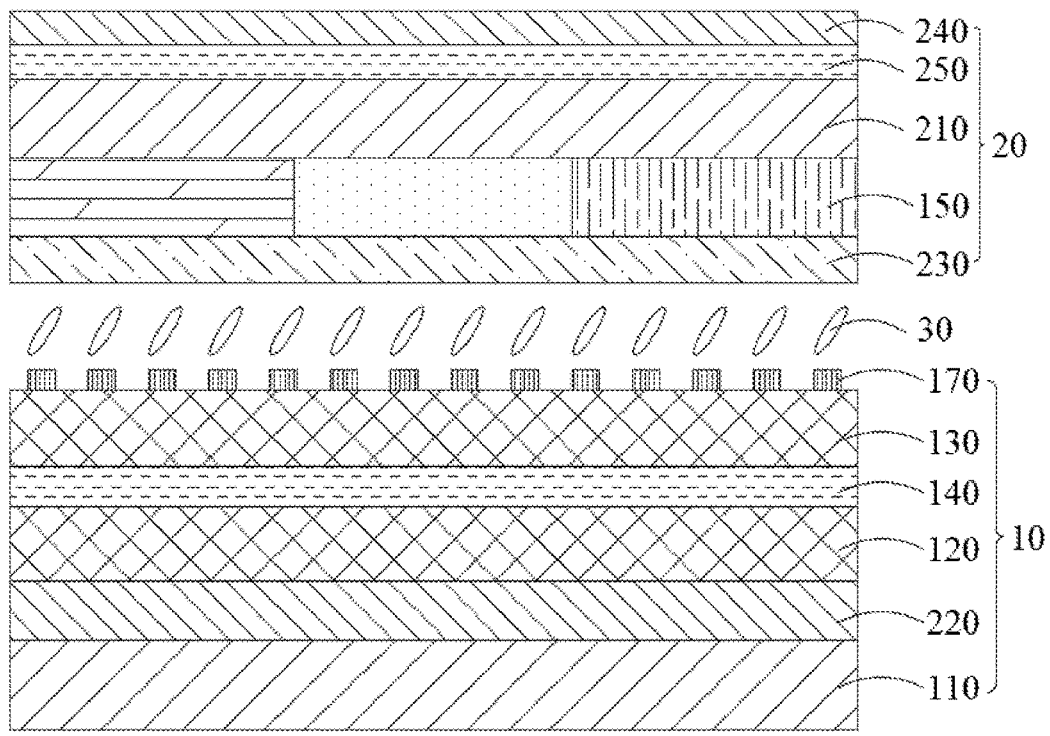
FIG. 6 is a schematic view illustrating the film layer structure of the display panel according to a fourth embodiment of the present application.

One embodiment is shown in FIG. 6. FIG. 6 is a schematic view of the film layer structure of the display panel according to a fourth embodiment of the present application. The display panel is a fringe-field switching liquid crystal display panel. The display panel has a structure substantially the same as the structure of the display panel shown in FIG. 1, except that:

The color filter layer 150 is disposed on one side of the second substrate 210 close to the array substrate 10. A protection layer 230 is disposed on a surface of the color filter layer 150 on one side close to the array substrate 10. The common electrode layer 220 is disposed on one side of the first substrate 110 close to the opposite substrate 20.

In the embodiment shown in FIG. 6, the opposite substrate 20 further includes a transparent conductive layer 240 and a second transparent insulating layer 250. The transparent conductive layer 240 is disposed on one side of the second substrate 210 away from the array substrate 10 to shield an external electric field. The second transparent insulating layer 250 is disposed between the second substrate 210 and the transparent conductive layer 240.

An absolute value of a difference between a refractive index of the second transparent insulating layer 250 and a refractive index of the second substrate 210 is greater than 0.2. An absolute value of a difference between a refractive index of the second transparent insulating layer 250 and a refractive index of the transparent conductive layer 240 is greater than 0.2.

It should be noted that, the second transparent insulating layer 250 with a relatively large difference in refractive index from the second substrate 210 and the transparent conductive layer 240 is added between the second substrate 210 and the transparent conductive layer 240, so the color points of the display panel can be adjusted by adjusting the thicknesses and the refractive indices of the first transparent insulating layer 140 and the second transparent insulating layer 250 at the same time. As a result, the present application can satisfy the requirements for different color point specifications without increasing the production costs, and prevent the reduction of energy efficiency caused by reducing gray scales.

In other embodiments, the display panel is provided with either the first transparent insulating layer 140 or the second transparent insulating layer 250. With this configuration, the present application can also satisfy different color point specifications without increasing the costs and prevent the reduction of energy efficiency caused by reducing gray scales.

Furthermore, the difference between the refractive index of the transparent conductive layer 240 and the refractive index of the second transparent insulating layer 250 is in a range from 0.2 to 0.5, and the difference between the refractive index of the second transparent insulating layer 250 and the refractive index of the second substrate 210 is in a range from 0.2 to 0.5. It can be understood that each of the above-mentioned ranges of the difference in refractive index between the film layers includes the values at two ends of the range.

In one embodiment, the refractive index of the transparent conductive layer 240 is in a range from 2.0 to 2.2, the refractive index of the second substrate 210 is in a range from 1.4 to 1.5, and the refractive index of the second transparent insulating layer 250 is in a range from 1.6 to 1.9. It can be understood that the above range of the refractive index of each film layer includes the values at two ends of the range.

Furthermore, a material of the transparent conductive layer 240 is indium tin oxide, the second substrate 210 is a glass substrate, and a material of the second transparent insulating layer 250 is any one of silicon oxide, silicon oxynitride, indium tin oxide, aluminum oxide, conductorized indium gallium zinc oxide, conductorized indium zinc oxide, or conductorized indium gallium zinc tin oxide. The material of the second transparent insulating layer 250 can be the same as or different from the material of the first transparent insulating layer 140, and the present application is not limited in this regard.

Figure 7:
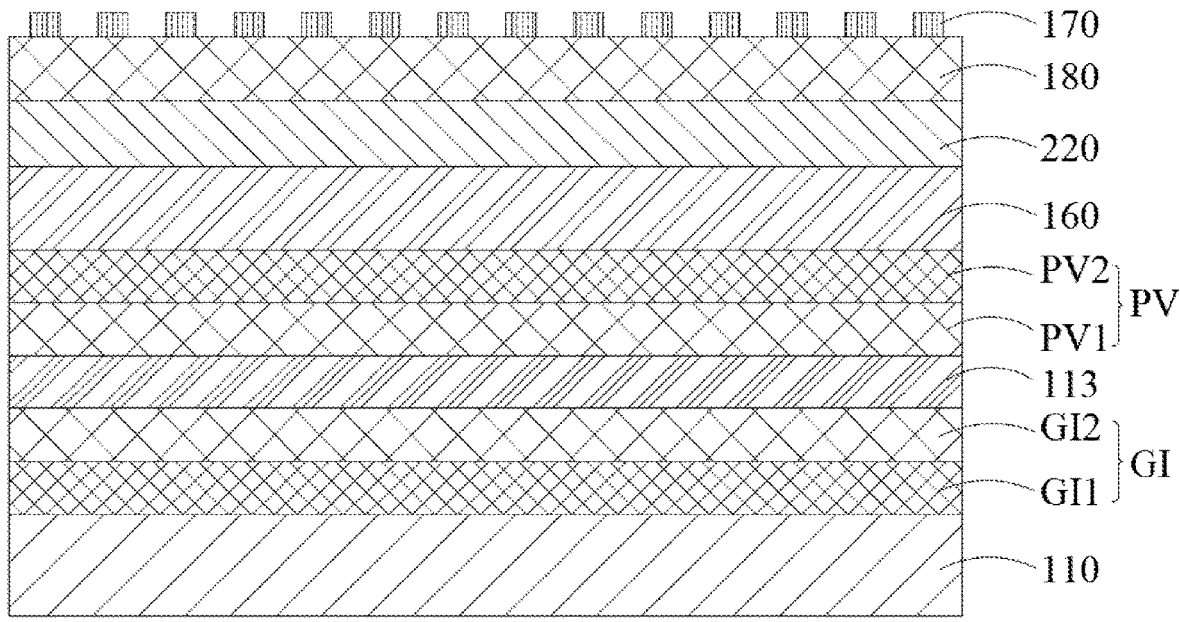
FIG. 7 is a schematic view illustrating the film layer structure of the display panel according to a fifth embodiment of the present application.

Please refer to FIG. 7, which is a schematic view of the film layer structure of the display panel according to the fifth embodiment of the present application. In FIG. 7, only the array substrate of the display panel is shown, and the opposite substrate of the display panel is not shown. The display panel is a fringe-field switching mode oxide semiconductor liquid crystal display panel. The array substrate includes a first metal layer, a gate insulating layer GI, an active layer 113, a second metal layer, a passivation protection layer PV, a planarization layer 160, a common electrode layer 220, a second passivation protection layer 180, and a pixel electrode layer 170 stacked on each other on the first substrate 110. A material of the active layer 113 is a metal oxide semiconductor, and the metal oxide semiconductor can specifically be, but not limited to, indium gallium zinc oxide.

Specifically, the gate insulating layer GI includes a first sub-gate insulating layer GI1 and a second sub-gate insulating layer GI2. The second sub-gate insulating layer GI2 is disposed between the first sub-gate insulating layer GI1 and the active layer 113. A material of the first sub-gate insulating layer GI1 is silicon nitride, and a material of the second sub-gate insulating layer GI2 is silicon oxide. The passivation protection layer PV includes a first sub-passivation protection layer PV1 and a second sub-passivation protection layer PV2. The first sub-passivation protection layer PV1 is disposed between the second sub-passivation protection layer PV2 and the active layer 113. A material of the first sub-passivation protection layer PV1 is silicon oxide, and a material of the second sub-passivation protection layer PV2 is silicon nitride. The second passivation protection layer 180 is disposed on a surface of the common electrode layer 220 facing away from the first substrate 110. A material of the second passivation protection layer 180 is silicon nitride.

The gate insulating layer GI is a laminated structure formed of silicon nitride and silicon oxide materials, and therefore, a difference in refractive index between the silicon nitride and silicon oxide materials is relatively large. As a result, there is no need to interpose the first transparent insulating layer in the laminated structure of the gate insulating layer GI or the passivation protection layer PV, and the color points of the display panel can still be adjusted simply by adjusting a thickness of any one or two layers in the laminated structure of the gate insulating layer GI.

In one embodiment, the thicknesses of the first sub-gate insulating layer GI1, the first sub-passivation protection layer PV1, the second sub-passivation protection layer PV2, and the second passivation protection layer 180 are not changed. The color points of the display panel can be adjusted by increasing or decreasing the thickness of the first sub-gate insulating layer GI1, so that the color points of the display panel can meet the product specification requirements.

In one embodiment, the thicknesses of the second sub-gate insulating layer GI2, the first sub-passivation protection layer PV1, the second sub-passivation protection layer PV2, and the second passivation protection layer 180 are not changed. The color points of the display panel can be adjusted by increasing or decreasing the thickness of the first sub-gate insulating layer GI1, so that the color points of the display panel can meet the product specification requirements.

In one embodiment, the thicknesses of the first sub-passivation protection layer PV1, the second sub-passivation protection layer PV2, and the second passivation protection layer 180 are not changed. The color points of the display panel can be adjusted by adjusting the thicknesses of the first sub-gate insulating layer GI1 and the second sub-gate insulating layer GI2 at the same time, so that the color points of the display panel can meet the product specification requirements.

In other embodiments, besides adjusting the thicknesses of the first sub-gate insulating layer GI1 and the second sub-gate insulating layer GI2 in the gate insulating layer GI, the color points of the display panel can also be adjusted by increasing or reducing the thicknesses of the first sub-passivation protection layer PV1 and/or the second sub-passivation protection layer PV2 in the passivation protection layer PV. In addition to that, the color points of the display panel can also be adjusted by increasing or decreasing the thickness of the second passivation protection layer 180.

In practice, the thicknesses of any two of the first sub-gate insulating layer GI1, the second sub-gate insulating layer GI2, the first sub-passivation protection layer PV1, the second sub-passivation protection layer PV2, and the second passivation protection layer 180 can be adjusted at the same time to adjust the color points of the display panel. Alternatively, the color points of the display panel can be adjusted simply by adjusting the thickness of any one of the first sub-gate insulating layer GI1, the second sub-gate insulating layer GI2, the first sub-passivation protection layer PV1, the second sub-passivation protection layer PV2, and the second passivation protection layer 180.

Figure 8:
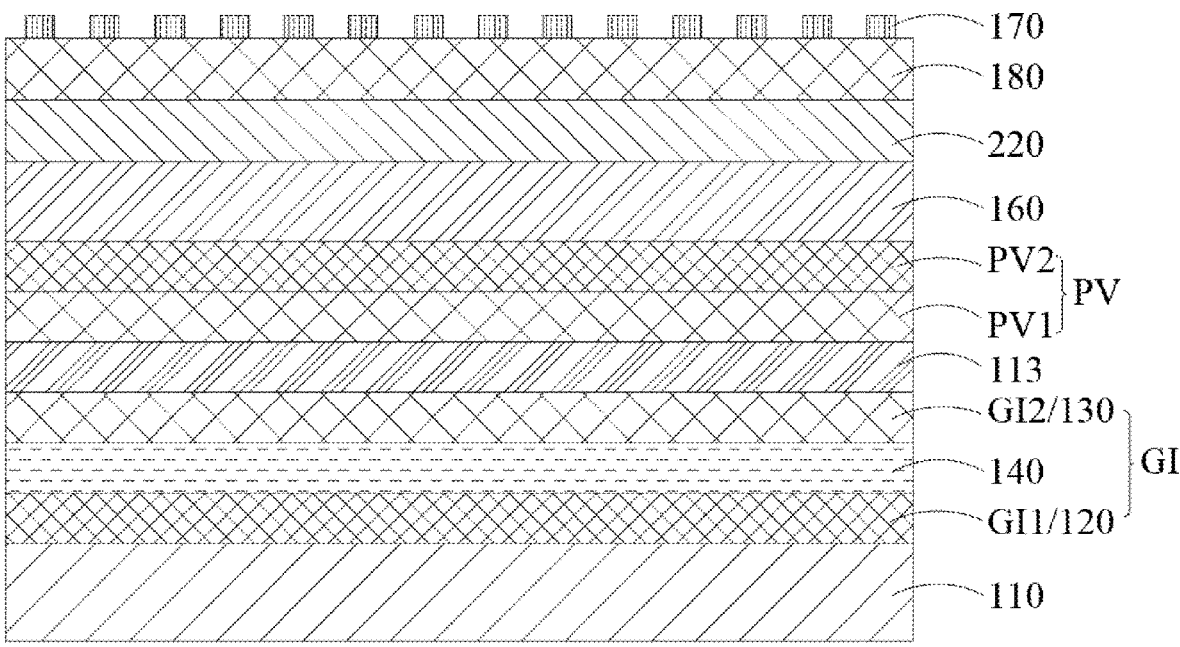
FIG. 8 is a schematic view illustrating the film layer structure of the display panel according to a sixth embodiment of the present application.

Please refer to FIG. 8, which is a schematic view of the film layer structure of the display panel according to the sixth embodiment of the present application. In the present embodiment, the display panel has a structure substantially the same as the structure of the display panel shown in FIG. 7, except that: The gate insulating layer GI further includes a first transparent insulating layer 140. The first transparent insulating layer 140 is disposed between the first sub-gate insulating layer GI1 and the second sub-gate insulating layer GI2, and is in direct contact with an entire surface of the first sub-gate insulating layer GI1 and an entire surface of the second sub-gate insulating layer GI2. The first sub-gate insulating layer GI1 can be regarded as the first insulating layer 120, and the second sub-gate insulating layer GI2 can be regarded as the second insulating layer 130.

A material of the first transparent insulating layer 140 is different from a material of the first insulating layer 120, and the material of the first transparent insulating layer 140 is different from a material of the second insulating layer 130. Specifically, the material of the first transparent insulating layer 140 is any one of silicon oxide, silicon oxynitride, indium tin oxide, aluminum oxide, conductorized indium gallium zinc oxide, conductorized indium zinc oxide, or conductorized indium gallium zinc tin oxide.

In the present embodiment, a refractive index of the first transparent insulating layer 140 is between a refractive index of the first insulating layer 120 and a refractive index of the second insulating layer 130. An absolute value of a difference between the refractive index of the first insulating layer 120 and the refractive index of the first transparent insulating layer 140 is in a range from 0.1 to 0.5. An absolute value of a difference between the refractive index of the second insulating layer 130 and the refractive index of the first transparent insulating layer 140 is in a range from 0.1 to 0.5. It can be understood that each of the above-mentioned ranges of the refractive index differences between the film layers includes the values at two ends of the range.

It should be noted that in the gate insulating layer GI, the first transparent insulating layer 140 with a relatively large refractive index difference is added between the first insulating layer 120 and the second insulating layer 130, so the color points of the oxide semiconductor liquid crystal display panel can be changed by adjusting the thickness and the refractive index of the first transparent insulating layer 140, so as to meet the requirements for different color point specifications.

In the present embodiment, the refractive index of the first insulating layer 120 is greater than the refractive index of the second insulating layer 130. The refractive index of the first insulating layer 120 is between 1.8 and 2.0. The refractive index of the second insulating layer 130 is between 1.4 and 1.5, and the refractive index of the first transparent insulating layer 140 is between 1.5 and 1.8. The refractive index of the first insulating layer 120 can be, but not limited to, 1.8, 1.81, 1.85, 1.9, 1.95, or 2.0. The refractive index of the second insulating layer 130 can be, but not limited to, 1.4, 1.41, 1.43, 1.45, 1.48, or 1.5. The refractive index of the first transparent insulating layer 140 can be, but not limited to, 1.5, 1.51, 1.55, 1.6, 1.7, 1.75, or 1.8.

Furthermore, the thickness of the first insulating layer 120 is in a range from 2000 angstroms to 4000 angstroms, the thickness of the second insulating layer 130 is in a range from 500 angstroms to 1500 angstroms, and the thickness of the first transparent insulating layer 140 is in a range from 200 angstroms and 1000 angstroms. It can be understood that each of the ranges of the thicknesses of the above film layers includes the values at two ends of the range.

The thickness of the first insulating layer 120 can be, but not limited to, 2000 angstroms, 2500 angstroms, 3000 angstroms, 3500 angstroms, or 4000 angstroms. The thickness of the second insulating layer 130 can be, but not limited to, 500 angstroms, 800 angstroms, 1200 angstroms, or 1500 angstroms. The thickness of the first transparent insulating layer 140 can be, but not limited to, 200 angstroms, 300 angstroms, 500 angstroms, 600 angstroms, 800 angstroms, or 1000 angstroms.

The thickness of the first transparent insulating layer 140 can be less than the thickness of the first insulating layer 120, and the thickness of the first transparent insulating layer 140 can also be less than the thickness of the second insulating layer 130, so that the color points of the display panel can be changed without affecting the light transmittance of the display panel.

Figure 9:
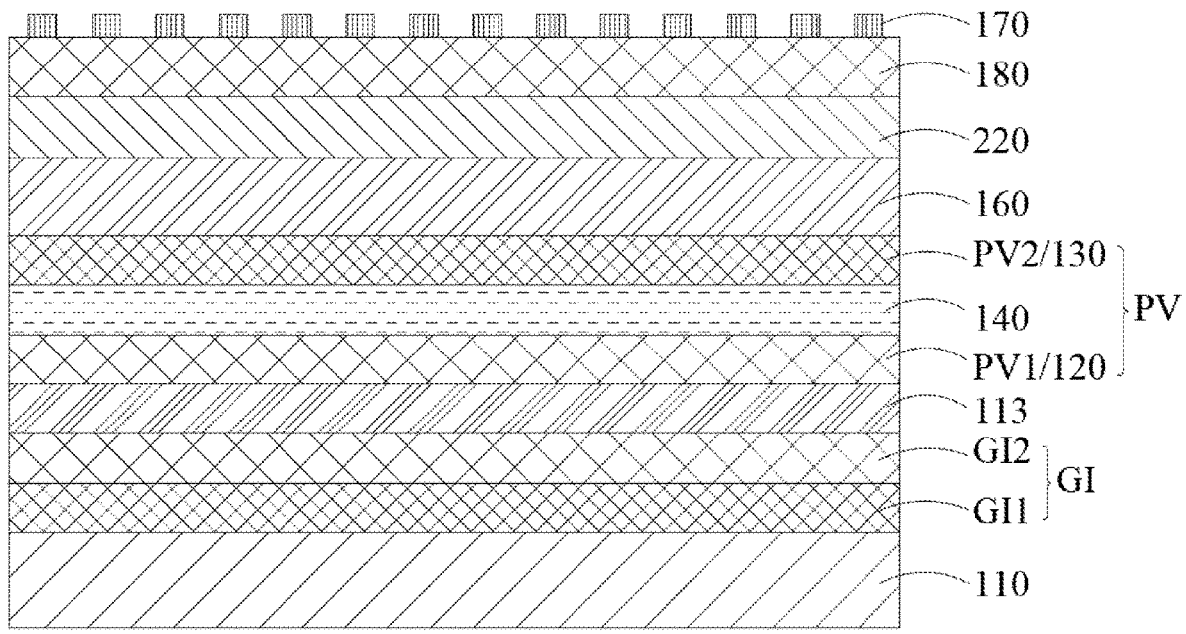
FIG. 9 is a schematic view illustrating the film layer structure of the display panel according to a seventh embodiment of the present application.

Please refer to FIG. 9, which is a schematic view of the film layer structure of the display panel according to a seventh embodiment of the present application. In FIG. 9, only the array substrate of the display panel is shown, and the opposite substrate of the display panel is not shown. A type and a structure of the display panel are substantially the same as the type and the structure of the display panel shown in FIG. 7, except the following: The passivation protection layer PV1 further includes a first transparent insulating layer 140. The first transparent insulation layer 140 is disposed between the first sub-passivation protection layer PV1 and the second sub-passivation protection layer PV2, and is in direct contact with the entire surface of the first sub-passivation protection layer PV1 and the entire surface of the second sub-passivation protection layer PV2. The first sub-passivation protection layer PV1 can be regarded as the first insulating layer 120, and the second sub-passivation protection layer PV2 can be regarded as the second insulating layer 130.

A material of the first transparent insulating layer 140 is different from a material of the first sub-passivation protection layer PV1. A material of the first transparent insulating layer 140 is different from a material of the second sub-passivation protection layer PV2. Specifically, the material of the first transparent insulating layer 140 is any one of silicon oxide, silicon oxynitride, ITO, aluminum oxide, conductorized indium gallium zinc oxide, conductorized indium zinc oxide, or conductorized indium gallium zinc tin oxide.

The refractive index of the first transparent insulating layer 140 is between the refractive index of the first sub-passivation protection layer PV1 and the refractive index of the second sub-passivation protection layer PV2. An absolute value of a difference between the refractive index the first sub-passivation protection layer PV1 and the refractive index of the first transparent insulating layer 140 is in a range from 0.1 to 0.5. An absolute value of a difference between the refractive index of the second sub-passivation protection layer PV2 and the refractive index of the first transparent insulating layer 140 in a range from 0.1 to 0.5. It can be understood that each of the absolute value ranges of the differences in refractive index between the above film layers includes the values at two ends of the range.

The first transparent insulating layer 140 with a relatively large difference in refractive index from the first sub-passivation protection layer PV1 and the second sub-passivation protection layer PV2 is added between the first sub-passivation protection layer PV1 and the second sub-passivation protection layer PV2. Consequently, the color points of the oxide semiconductor liquid crystal display panel can be changed by adjusting the thickness and the refractive index of the first transparent insulation layer 140, so as to meet the requirements for different color point specifications.

Further, the refractive index of the first sub-passivation protection layer PV1 is between 1.4 and 1.5, the refractive index of the second sub-passivation protection layer PV2 is between 1.8 and 2.0, and the refractive index of the first transparent insulating layer 140 is between 1.5 and 1.8. The refractive index of the second sub-passivation protection layer PV2 can be, but not limited to, 1.8, 1.81, 1.85, 1.9, 1.95, or 2.0. The refractive index of the first sub-passivation protection layer PV1 can be, but not limited to, 1.4, 1.41, 1.43, 1.45, 1.48, or 1.5. The refractive index of the first transparent insulating layer 140 can be, but not limited to, 1.5, 1.51, 1.55, 1.6, 1.7, 1.75, or 1.8.

Further, the thickness of the first sub-passivation protection layer PV1 is in a range from 2000 angstroms to 4000 angstroms. The thickness of the second sub-passivation protection layer PV2 is in a range from 500 angstroms to 2000 angstroms. The thickness of the first transparent insulating layer 140 is in a range from 200 angstroms to 1000 angstroms. It can be understood that each of the ranges of the thicknesses of the above film layers includes the values at two ends of the range.

The thickness of the first sub-passivation protection layer PV1 can be, but not limited to, 2000 angstroms, 2500 angstroms, 3000 angstroms, 3500 angstroms, or 4000 angstroms. The thickness of the second sub-passivation protection layer PV2 can be, but not limited to, 500 angstroms, 800 angstroms, 1200 angstroms, 1500 angstroms, or 2000 angstroms. The thickness of the first transparent insulating layer 140 can be, but not limited to, 200 angstroms, 300 angstroms, 500 angstroms, 600 angstroms, 800 angstroms, or 1000 angstroms.

In practice, the first transparent insulating layer 140 can be interposed in the laminated structure of the gate insulating layer GI formed of silicon nitride and silicon oxide and interposed in the laminated structure of the passivation protection layer PV formed of silicon nitride and silicon oxide. Alternatively, the first transparent insulating layer 140 can be interposed either the laminated structure of the gate insulating layer GI or the laminated structure of the passivation protection layer PV formed of silicon nitride and silicon oxide. With this configuration, the color points of the oxide semiconductor thin film transistor liquid crystal display panel can also be changed to satisfy the requirements for different color point specifications.

Figure 10:
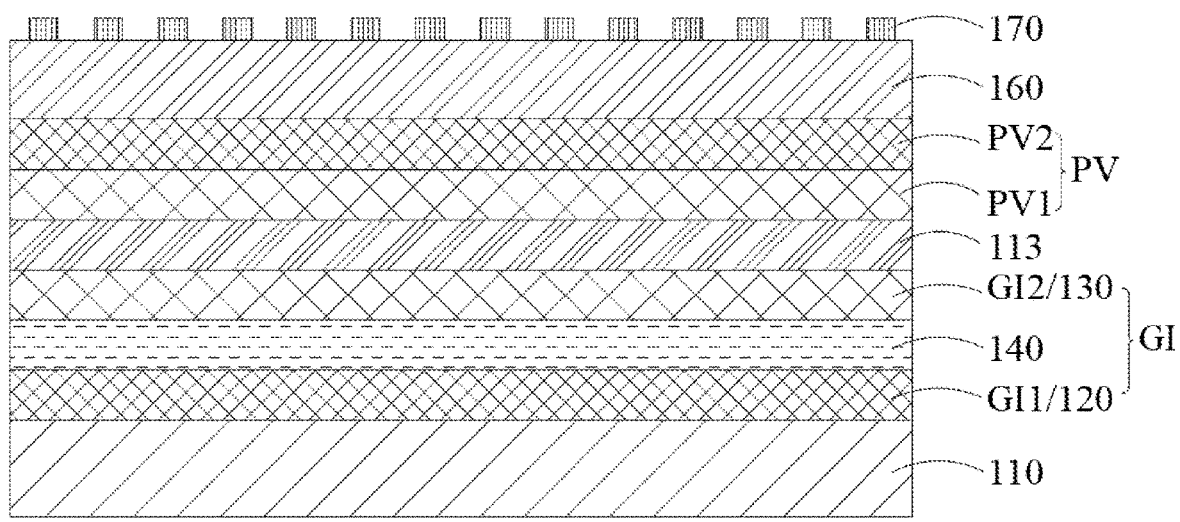
FIG. 10 is a schematic view illustrating the film layer structure of the display panel according to an eighth embodiment of the present application.

Please refer to FIG. 10, which is a schematic view illustrating the film layer structure of the display panel according to an eighth embodiment of the present application. In FIG. 10, only the array substrate of the display panel is shown, and the opposite substrate of the display panel is not shown. The display panel shown in FIG. 10 is a vertical alignment oxide thin film transistor liquid crystal display panel. The display panel has a structure substantially the same as the structure of the display panel shown in FIG. 8, except the following: The array substrate of the display panel does not include a common electrode layer and a second passivation protection layer, and the common electrode layer can be arranged on the opposite substrate.

In the embodiment shown in FIG. 10, the first transparent insulating layer 140 is disposed between the first insulating layer 120 and the second insulating layer 130 of the gate insulating layer GI for adjusting the color points of the display panel. The passivation protection layer PV only has the first sub-passivation protection layer PV1 and the second sub-passivation protection layer PV2.

In practice, the passivation protection layer PV in the vertical alignment oxide thin film transistor liquid crystal display panel shown in FIG. 10 can also have the same structure as the passivation protection layer in FIG. 9 to adjust the color points of the display panel. For the specific structure of the passivation protection layer PV, reference may be made to the above-mentioned embodiments, and a detailed description thereof is omitted herein for brevity.

The present application further provides a display device including a display panel 100, wherein the display panel 100 includes an array substrate 10. The laminated structure, connection relationship, materials, functions, and effects of the array substrate 10 in the present embodiment are the same as those in the above embodiments, so a detailed description thereof is omitted herein for brevity.

Advantages of the present application: The present application provides a display panel. The display panel includes an array substrate. The array substrate includes a first substrate, a first insulating layer, a second insulating layer, and a first transparent insulating layer. The first insulating layer is disposed on the first substrate. The second insulating layer is disposed on one side of the first insulating layer away from or close to the first substrate. The first transparent insulating layer is disposed between the first insulating layer and the second insulating layer. An absolute value of a difference between a refractive index of the first transparent insulating layer and a refractive index of the first insulating layer is greater than 0.1. An absolute value of a difference between the refractive index of the first transparent insulating layer and a refractive index of the second insulating layer is greater than 0.1. The first transparent insulating layer is added between the first insulating layer and the second insulating layer to cause a large difference in refractive index, thereby adjusting color points of the display panel to meet requirements for different color point specifications without a need to reduce gray scales of the display panel. As a result, the energy efficiency of the display panel is improved.

In summary, although the present application is disclosed above with preferable embodiments, the above preferable embodiments are not intended to limit the present application. Those of ordinary skill in the art can make various modifications without departing from the spirit and scope of the present application. Therefore, the protection scope of the present application should be defined by the appended claims.

What is claimed is:

1. A display panel, comprising an array substrate, wherein the display panel comprises:
    a first substrate;
    a first insulating layer disposed on the first substrate;
    a second insulating layer disposed on one side of the first insulating layer away from the first substrate;
    a first transparent insulating layer disposed between the first insulating layer and the second insulating layer, and in direct contact with at least a portion of the first insulating layer and at least portion of the second insulating layer; and
    an opposite substrate disposed corresponding to the array substrate, the opposite substrate comprising a second substrate, a transparent conductive layer, and a second transparent insulating layer, wherein the transparent conductive layer is disposed on one side of the second substrate away from the array substrate, and the second transparent insulating layer is disposed between the second substrate and the transparent conductive layer;
    wherein an absolute value of a difference between a refractive index of the first transparent insulating layer and a refractive index of the first insulating layer is greater than 0.1, and an absolute value of a difference between the refractive index of the first transparent insulating layer and a refractive index of the second insulating layer is greater than 0.1;
    wherein an absolute value of a difference between a refractive index of the second transparent insulating layer and a refractive index of the second substrate is greater than 0.2, and an absolute value of a difference between the refractive index of the second transparent insulating layer and a refractive index of the transparent conductive layer is greater than 0.2.

2. The display panel according to claim 1, wherein a material of the first insulating layer is same as a material of the second insulating layer, a material of the first transparent insulating layer is different from the material of the first insulating layer and the material of the second insulating layer, and the refractive index of the first insulating layer and the refractive index of the second insulating layer are both greater than the refractive index of the first transparent insulating layer.

3. The display panel according to claim 2, wherein the difference between the refractive index of the first insulating layer and the refractive index of the first transparent insulating layer ranges from 0.2 to 0.5, and the difference between the refractive index of the second insulating layer and the refractive index of the first transparent insulating layer ranges from 0.2 to 0.5.

4. The display panel according to claim 3, wherein the array substrate comprises:
    a first metal layer comprising a gate and a gate line, wherein the first metal layer is disposed between the first insulating layer and the first substrate; and
    a second metal layer comprising a source and a drain, wherein the second metal layer is disposed between the first insulating layer and the second insulating layer;
    wherein the first transparent insulating layer is disposed between the second metal layer and the first insulating layer, or the first transparent insulating layer is disposed between the second metal layer and the second insulating layer.

5. The display panel according to claim 2, wherein the array substrate comprises:
    a first metal layer comprising a gate and a gate line, wherein the first metal layer is disposed between the first insulating layer and the first substrate; and
    a second metal layer comprising a source and a drain, wherein the second metal layer is disposed between the first insulating layer and the second insulating layer;
    wherein the first transparent insulating layer is disposed between the second metal layer and the first insulating layer, or the first transparent insulating layer is disposed between the second metal layer and the second insulating layer.

6. The display panel according to claim 2, wherein the material of the first transparent insulating layer is any one of silicon oxide, silicon oxynitride, indium tin oxide, aluminum oxide, conductorized indium gallium zinc oxide, conductorized indium zinc oxide, or conductorized indium gallium zinc tin oxide.

7. The display panel according to claim 1, wherein the array substrate comprises an active layer, a material of the active layer comprises an oxide semiconductor, a material of the first insulating layer is different from a material of the second insulating layer, and the refractive index of the first transparent insulating layer is between the refractive index of the first insulating layer and the refractive index of the second insulating layer.

8. The display panel according to claim 7, wherein the absolute value of the difference between the refractive index of the first insulating layer and the refractive index of the first transparent insulating layer ranges from 0.1 to 0.5, and the absolute value of the difference between the refractive index of the second insulating layer and the refractive index of the first transparent insulating layer ranges from 0.1 to 0.5.

9. The display panel according to claim 7, wherein a material of the first insulating layer is silicon nitride, a material of the second insulating layer is silicon oxide, and a material of the first transparent insulating layer is different from the material of the first insulating layer and the material of the second insulating layer, and the second insulating layer is disposed between the first insulating layer and the active layer.

10. The display panel according to claim 7, wherein the material of the first transparent insulating layer is any one of silicon oxide, silicon oxynitride, indium tin oxide, aluminum oxide, conductorized indium gallium zinc oxide, conductorized indium zinc oxide, or conductorized indium gallium zinc tin oxide.

11. The display panel according to claim 1, wherein the refractive index of the transparent conductive layer is greater than the refractive index of the second substrate, and the refractive index of the second transparent insulating layer is between the refractive index of the transparent conductive layer and the refractive index of the second substrate.

12. A display device comprising a display panel, the display panel comprising an array substrate, wherein the display device comprises:
a first substrate;
a first insulating layer disposed on the first substrate;
a second insulating layer disposed on one side of the first insulating layer away from the first substrate;
a first transparent insulating layer disposed between the first insulating layer and the second insulating layer, and in direct contact with at least a portion of the first insulating layer and at least portion of the second insulating layer; and
an opposite substrate disposed corresponding to the array substrate, the opposite substrate comprising a second substrate, a transparent conductive layer, and a second transparent insulating layer, wherein the transparent conductive layer is disposed on one side of the second substrate away from the array substrate, and the second transparent insulating layer is disposed between the second substrate and the transparent conductive layer;
wherein an absolute value of a difference between a refractive index of the first transparent insulating layer and a refractive index of the first insulating layer is greater than 0.1, and an absolute value of a difference between the refractive index of the first transparent insulating layer and a refractive index of the second insulating layer is greater than 0.1;
wherein an absolute value of a difference between a refractive index of the second transparent insulating layer and a refractive index of the second substrate is greater than 0.2, and an absolute value of a difference between the refractive index of the second transparent insulating layer and a refractive index of the transparent conductive layer is greater than 0.2.

13. The display device according to claim 12, wherein a material of the first insulating layer is same as a material of the second insulating layer, a material of the first transparent insulating layer is different from the material of the first insulating layer and the material of the second insulating layer, and the refractive index of the first insulating layer and the refractive index of the second insulating layer are both greater than the refractive index of the first transparent insulating layer.

14. The display device according to claim 13, wherein the difference between the refractive index of the first insulating layer and the refractive index of the first transparent insulating layer ranges from 0.2 to 0.5, and the difference between the refractive index of the second insulating layer and the refractive index of the first transparent insulating layer ranges from 0.2 to 0.5.

15. The display device according to claim 13, wherein the array substrate comprises:
a first metal layer comprising a gate and a gate line, wherein the first metal layer is disposed between the first insulating layer and the first substrate; and
a second metal layer comprising a source and a drain, wherein the second metal layer is disposed between the first insulating layer and the second insulating layer;
wherein the first transparent insulating layer is disposed between the second metal layer and the first insulating layer, or the first transparent insulating layer is disposed between the second metal layer and the second insulating layer.

16. The display device according to claim 13, wherein the absolute value of the difference between the refractive index of the first insulating layer and the refractive index of the first transparent insulating layer ranges from 0.1 to 0.5, and the absolute value of the difference between the refractive index of the second insulating layer and the refractive index of the first transparent insulating layer ranges from 0.1 to 0.5.

17. The display device according to claim 12, wherein the array substrate comprises an active layer, a material of the active layer comprises an oxide semiconductor, a material of the first insulating layer is different from a material of the second insulating layer, and the refractive index of the first transparent insulating layer is between the refractive index of the first insulating layer and the refractive index of the second insulating layer.

18. The display device according to claim 17, wherein a material of the first insulating layer is silicon nitride, a material of the second insulating layer is silicon oxide, and a material of the first transparent insulating layer is different from the material of the first insulating layer and the material of the second insulating layer, and the second insulating layer is disposed between the first insulating layer and the active layer.

* * * * *